United States Patent [19]

Anderson

[11] Patent Number: 4,961,059
[45] Date of Patent: Oct. 2, 1990

[54] COMBINED RFI REJECTION AND INTERGRATING TWO-SECTION FILTER

[75] Inventor: Mark R. Anderson, Indianapolis, Ind.

[73] Assignee: RCA Licensing Corporation, Princeton, N.J.

[21] Appl. No.: 190,843

[22] Filed: May 6, 1988

[51] Int. Cl.[5] .................. H03H 7/06; H03H 1/02
[52] U.S. Cl. ................................. 333/19; 333/20; 333/167; 333/168; 333/172
[58] Field of Search ............... 333/172, 168, 167, 19, 333/20, 12; 307/264, 520; 358/188, 196, 198; 455/232, 233

[56] References Cited

U.S. PATENT DOCUMENTS

| | | | |
|---|---|---|---|
| 2,143,398 | 1/1939 | White | 333/19 X |
| 2,449,035 | 9/1948 | Coffin, Jr. et al. | 333/19 X |
| 3,890,592 | 6/1975 | Kitamura et al. | 455/233 X |
| 4,104,593 | 8/1978 | Orii | 455/232 X |
| 4,560,963 | 12/1985 | Sharpe | 333/172 |
| 4,586,008 | 4/1986 | Raleigh | 333/172 X |
| 4,721,870 | 1/1988 | Rector et al. | 333/172 X |

FOREIGN PATENT DOCUMENTS

| | | | |
|---|---|---|---|
| 1928514 | 12/1970 | Fed. Rep. of Germany | 333/172 |
| 3406671 | 8/1985 | Fed. Rep. of Germany | 333/12 |
| 873386 | 10/1981 | U.S.S.R. | 333/172 |

OTHER PUBLICATIONS

"Introduction to Electric Circuit Analysis", by Ronald J. Tocci, published by Charles E. Merrill Publishing Company, pp. 678-688.

Primary Examiner—Eugene R. LaRoche
Assistant Examiner—Benny E. Lee
Attorney, Agent, or Firm—Joseph S. Tripoli; Peter M. Emanuel

[57] ABSTRACT

A combined RFI filter and low pass filter includes two sections, both of which serve as both radio frequency interference filters and low pass filters, or dc integrators. Both sections have substantially equal time constants and employ non-polarized capacitors.

8 Claims, 1 Drawing Sheet

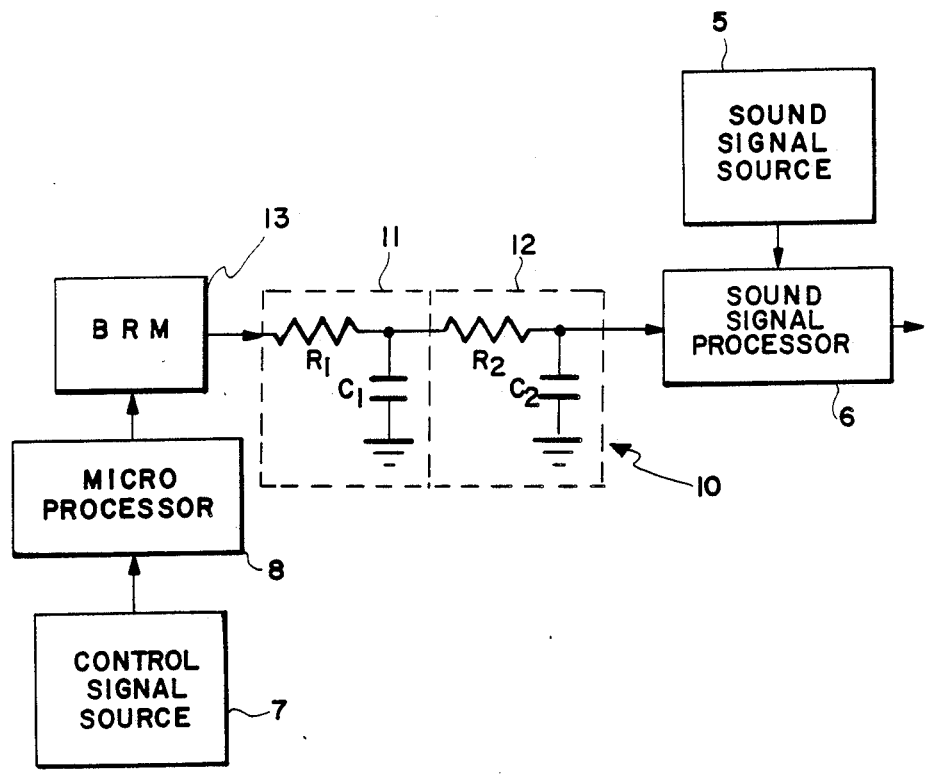

COMBINED RFI REJECTION AND INTERGRATING TWO-SECTION FILTER

BACKGROUND

This invention relates generally to electrical signal filters, and particularly to such filters for filtering a binary information signal to be used for signal control purposes.

Video signal processing systems, such as television receivers, are increasingly using digital processing and digital control techniques. Digital control systems can be implemented in a variety of ways and using a variety of available digital processing circuitry, such as binary rate multiplier (BRM). For example, a CD 40891B BRM available from the Solid State Division of RCA Corporation, or a SN 5497 BRM available from Texas Instruments Corporation can be used for such processing.

The digital control signal for both monaural and stereo sound systems, including those for TV receivers, are typically passed through both radio frequency interference (RFI) and low pass filters before being applied to the circuit being controlled. Typically, in the prior art, the audio control signals are passed through a RFI filter having a short time constant to suppress high frequency components of the control signal. The RFI filter section is followed by an integration filter section having a longer time constant than the RFI filter. The longer time constant integrates the digital control signal to a dc value, and also prevents the control signal from causing an audible "pop" to be generated when the control signal is changed between a high level and a low level. The fully filtered control signal can be used to adjust the bass, treble and balance of the audio signal. The prior art two-section filters are disadvantageous because the integration pole having the longer time constant uses electrolytic capacitors, which are polarized, i.e. not bilateral and therefore are subject to being inserted backwards unless care is taken. Electrolytic capacitors are physically larger than unpolarized chip or disc capacitors, an important consideration in equipment using solid state devices, where size is an important consideration. Additionally, electrolytic capacitors are more expensive, which is a major consideration in the competitive field of consumer electronics, such as television receivers. For these reasons, there is a need for a combined RFI filter and a low pass filter, or dc integrator, which does not require electrolytic capacitors. The present invention fulfills these needs.

SUMMARY OF THE INVENTION

A two section filter includes a first section having a first time constant whereby the section is a radio frequency interference filter and an integrator, and a second section responsive to the first pole and having a time constant whereby the second section also is a second radio frequency interference filter and an integrator.

BRIEF DESCRIPTION OF THE DRAWINGS

The FIGURE is a preferred embodiment.

DETAILED DESCRIPTION OF THE INVENTION

In the FIGURE, a sound signal from a source 5 is provided to a sound signal processor 6 which amplifies the sound signal to a magnitude suitable for driving a sound reproducing device (not shown). The magnitude of the sound signal, and hence the volume of reproduced sound information, is ultimately controlled in response to a control signal from a source 7. In this example the control signal from source 7, e.g., a consumer operated volume control, is in binary form, suitable for processing by a microprocessor 8. An interface unit included within source 7 formats a consumer generated control signal into an N-bit serial or parallel binary signal containing coded information which provides microprocessor 8 with suitable instructions for incrementing or decrementing the memory value for the volume function.

Microprocessor 8 provides an N-bit binary signal output to a binary rate multiplier (BRM) 13 of known configuration. A binary output signal from BRM 13, in pulse-width-modulated form, is coupled via a filter 10 in accordance with the present invention to a DC volume control input of processor 6. The output signal from BRM 13 comprises substantially constant amplitude pulses at a frequency of approximately 4 KHz and with a pulse width (duty factor) determined by the volume control information supplied from microprocessor 8. The duty factor of the pulse signal produced by BRM 13, after filtering by filter 10, determines the value of the DC signal applied to the control input of processor 6.

BRM output filter 10 is a combined RFI/dc integration two-section filter including a first input section 11 and a second output section 12. The first section 11 is comprised of a series resistor R1 and a shunt capacitor C1 arranged as shown. The values of the resistor R1 and capacitor C1 are selected to establish a pole such that the section 11 serves as both a radio frequency interference filter and an integrator for the control signal from BRM 13. Exemplary values for R1 and C1 are 33K ohm and 0.22 microfarads, respectively. The second section 12 is responsive to output signals from the first section 11 and includes a resistor R2 and a capacitor C2. As in the case of elements R1 and C1, the values for the resistor R2 capacitor C2 are selected to establish a pole so that for the frequency of the BRM output control signal the second section 12 also serves as both a radio frequency interference filter and an integrator, or low pass filter. The poles or time constants for first section 11 and the second section 12 can be substantially equal in which case the exemplary values for R1 and C1 are also pertinent for the values of R2 and C2 respectively.

Equal values for resistors R1 and R2 and for capacitors C1 and C2 aid manufacturability, in which case the first and second filter sections have equal time constants. The disclosed filter exhibits a good RFI and integration response even with interaction between the filter sections, i.e., even though the values of the second section do not exceed those of the first section by 10 times or more to prevent the second section from loading the first section. The disclosed filter arrangement permits both sections to use relatively inexpensive non-polarized, non-electrolytic capacitors which are less likely to be installed improperly.

What is claimed is:
1. Apparatus comprising:
   control means for providing a pulse signal encoded in binary form with control information for a function to be controlled;
   filter means for filtering said pulse signal to produce a DC control signal; and processing means for performing said function in response to said DC control signal;

said filter means including first and second R-C sections configured as low pass filters coupled in cascade between said control means and said processing means; said first R-C section including a first resistor connected in a signal path between said control means and said processing means, and a first capacitor connected in shunt with said path; said second R-C section including a second resistor connected in series with said first resistor in said path, without an intervening impedance isolating element, and a second capacitors being of a non-electrolytic type; the values of said first resistor and said first capacitor being selected to establish a pole so that said first section both integrates said pulse signal and suppresses RFI components which might otherwise appear in said control signal; the values of said second resistor and said second capacitor being substantially equal to the respective values of said first resistor and said first capacitor to also establish a pole such that said second section also both integrates said pulse signal and suppresses RFI components which might otherwise appear in said control signal.

2. The apparatus defined in claim 1, wherein:
said processing means processes a sound signal.

3. The apparatus defined in claim 1, wherein:
said pulse signal is encoded in pulse-width modulation form.

4. The apparatus defined in claim 1, wherein:
control means includes a binary rate multiplier for producing said pulse signal.

5. Apparatus, comprising:
processing means for controlling a characteristic of a signal in response to a DC control signal;
user interface means for generating a digital signal representing adjustment information related to said characteristic;
pulse signal generating means responsive to said digital signal for generating a pulse signal modulated in accordance with said adjustment information;
filter means for filtering said modulated pulse signal to produce said DC control signal; said filter means including first and second R-C sections configured as low pass filters coupled in cascade between said pulse signal generating means and said processing means; said first R-C section including a first resistor connected in a signal path between said pulse signal generating means and said processing means, and a first capacitor connected in shunt with said path; said second R-C section including a second resistor connected in series with said first resistor in said path, without an intervening isolating element, and a second capacitor connected in shunt with said path; said first resistor and said first capacitor being selected to establish a pole suitable for both integrating said modulated pulse signal and suppressing high frequency components which might otherwise appear in said control signal; said first and second capacitors being of the non-electrolytic type; the values of said second resistor and said second capacitor being substantially equal to the respective values of said first resistor and said first capacitor to also establish a pole suitable for both integrating said modulated pulse signal and suppressing high frequency components which might otherwise appear in said control signal.

6. The apparatus defined in claim 5, wherein:
said pulse signal generating means includes a binary rate multiplier.

7. The apparatus defined in claim 5, wherein:
said pulse signal has a duty factor determined by said adjustment information.

8. The apparatus defined in claim 5, wherein:
said signal is a sound signal.

* * * * *

UNITED STATES PATENT AND TRADEMARK OFFICE
CERTIFICATE OF CORRECTION

PATENT NO. : 4,961,059

DATED : October 2, 1990

INVENTOR(S) : Mark Robert Anderson

It is certified that error appears in the above-identified patent and that said Letters Patent is hereby corrected as shown below:

Column 3, line 13 (Claim 1): after "second" insert --capacitor connected in shunt with said path; said first and second --

Signed and Sealed this

Fourteenth Day of January, 1992

*Attest:*

HARRY F. MANBECK, JR.

*Attesting Officer*  *Commissioner of Patents and Trademarks*